(12) United States Patent
Okawa et al.

(10) Patent No.: US 6,555,857 B1
(45) Date of Patent: Apr. 29, 2003

(54) SEMICONDUCTOR DEVICE

(75) Inventors: Shigeaki Okawa, Tochigi (JP); Toshiyuki Ohkoda, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/520,950

(22) Filed: Mar. 8, 2000

(30) Foreign Application Priority Data

Mar. 9, 1999 (JP) .......................................... 11-061415

(51) Int. Cl.⁷ ........................ H01L 29/80; H01L 31/112
(52) U.S. Cl. ...................... 257/273; 257/272; 257/277; 257/264; 438/189; 438/190; 438/309
(58) Field of Search ................................ 257/273, 226, 257/235, 489, 264, 239, 272, 134, 256, 265, 275, 277; 438/189, 309, 190, 186, 194, 196

(56) References Cited

U.S. PATENT DOCUMENTS

| 5,254,864 A | * | 10/1993 | Ogawa | 257/273 |
| 5,273,912 A |   | 12/1993 | Hikida | |
| 5,605,851 A | * | 2/1997 | Palmieri et al. | 437/33 |
| 5,670,819 A |   | 9/1997 | Yamaguchi | |
| 5,804,476 A | * | 9/1998 | Jang | 438/202 |

FOREIGN PATENT DOCUMENTS

| GB | 2 243 485 | 10/1991 |
| JP | 58-197885 | 11/1983 |
| JP | 58-197885 A | * 11/1983 |
| JP | 61-160963 | 7/1986 |
| JP | 61-242059 | 10/1986 |
| JP | 62-229869 A | * 10/1987 |

* cited by examiner

*Primary Examiner*—Tom Thomas
*Assistant Examiner*—Donghee Kang
(74) *Attorney, Agent, or Firm*—Wenderoth, Lind & Ponack, L.L.P.

(57) ABSTRACT

The object of the present invention is to provide a semiconductor device, which is suitable for use to connect electric condenser microphones. A semiconductor device, comprises: a conductivity-type substrate; an epitaxial layer formed on top of the substrate; island regions separating the epitaxial layer; an input transistor formed on one of the island regions; an insulation layer covering the surface of the input transistor layer; an expansion electrode formed above the insulation layer so as to provide an electrical connection to an input terminal of the input transistor; and resistivity of the epitaxial layer formed below the expansion electrode being in a range of 1000~5,000 Ω·cm.

12 Claims, 10 Drawing Sheets

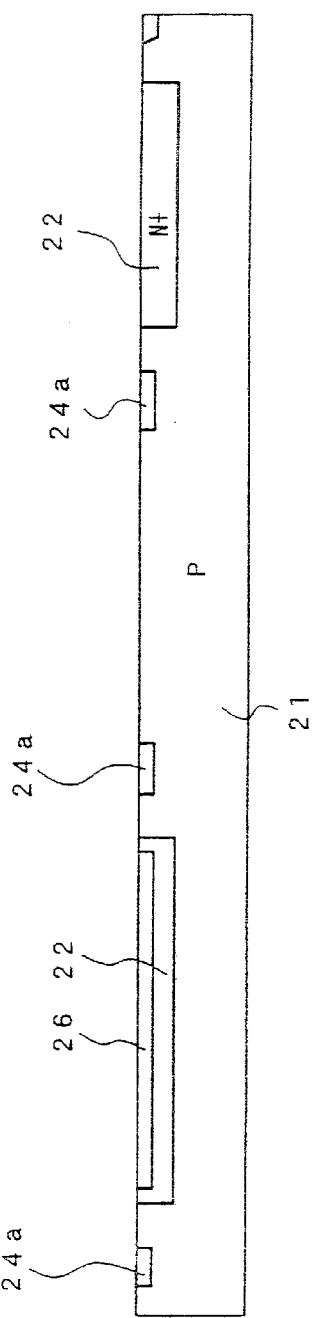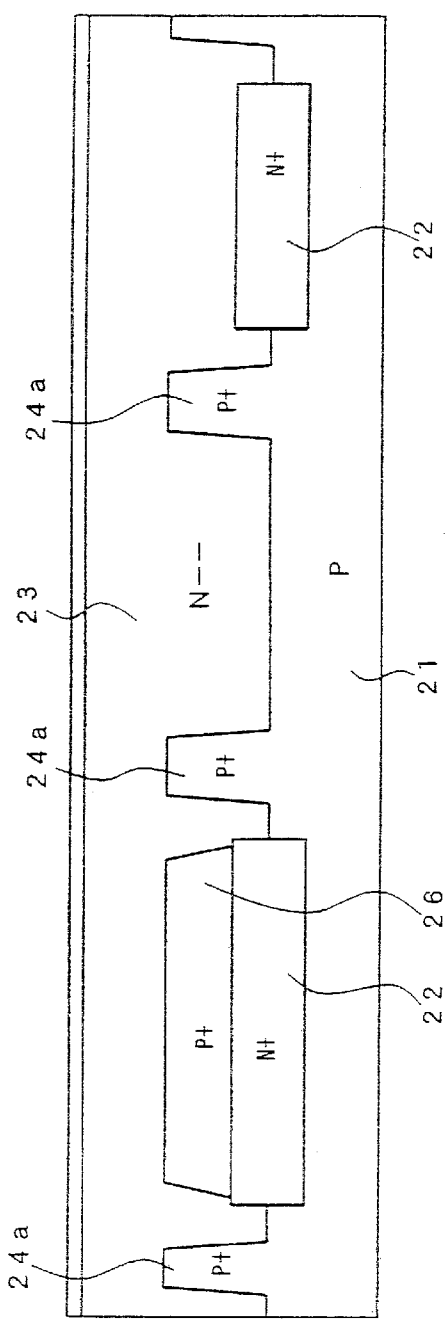
FIG. 6A
FIG. 6B

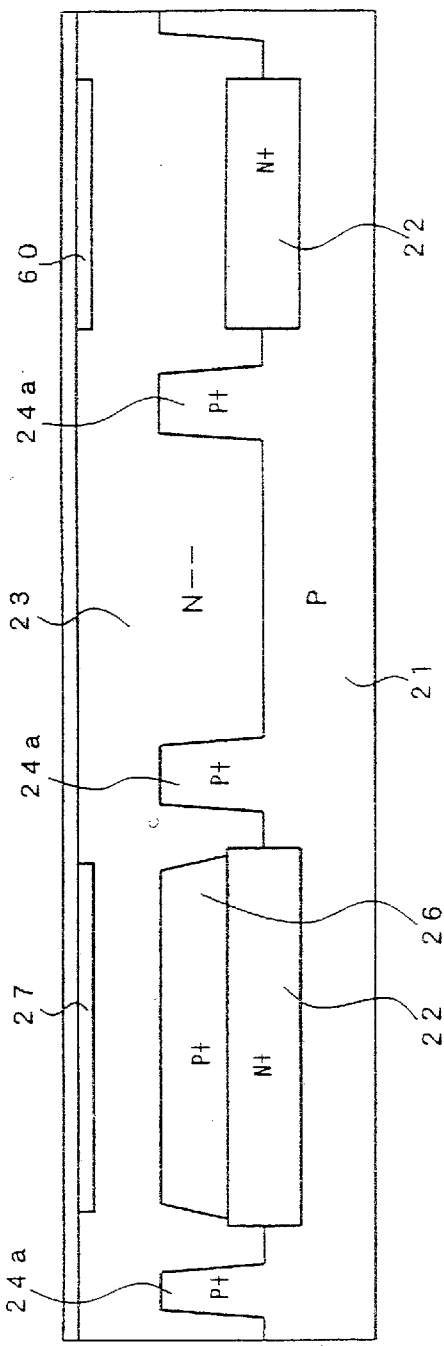
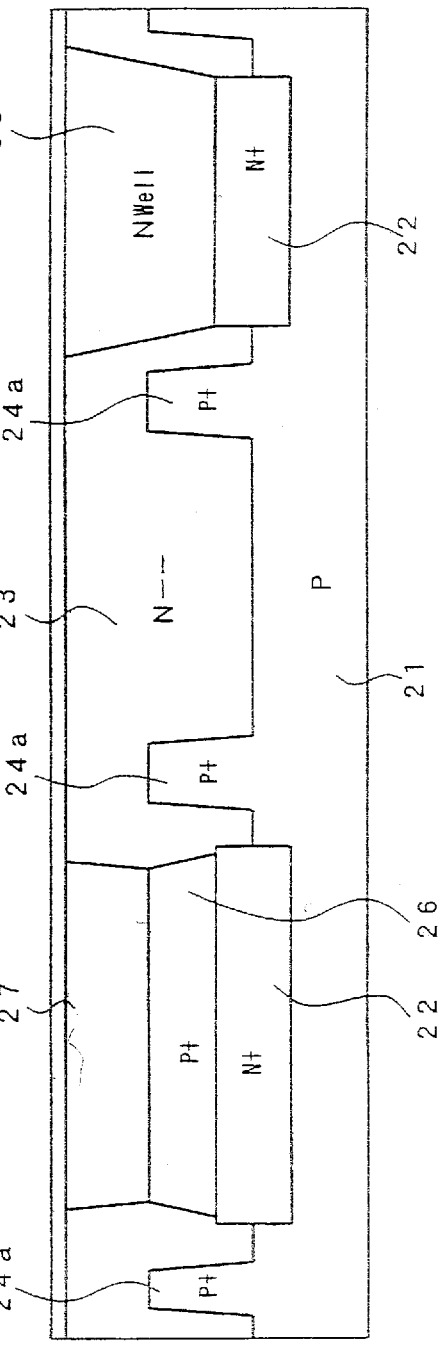

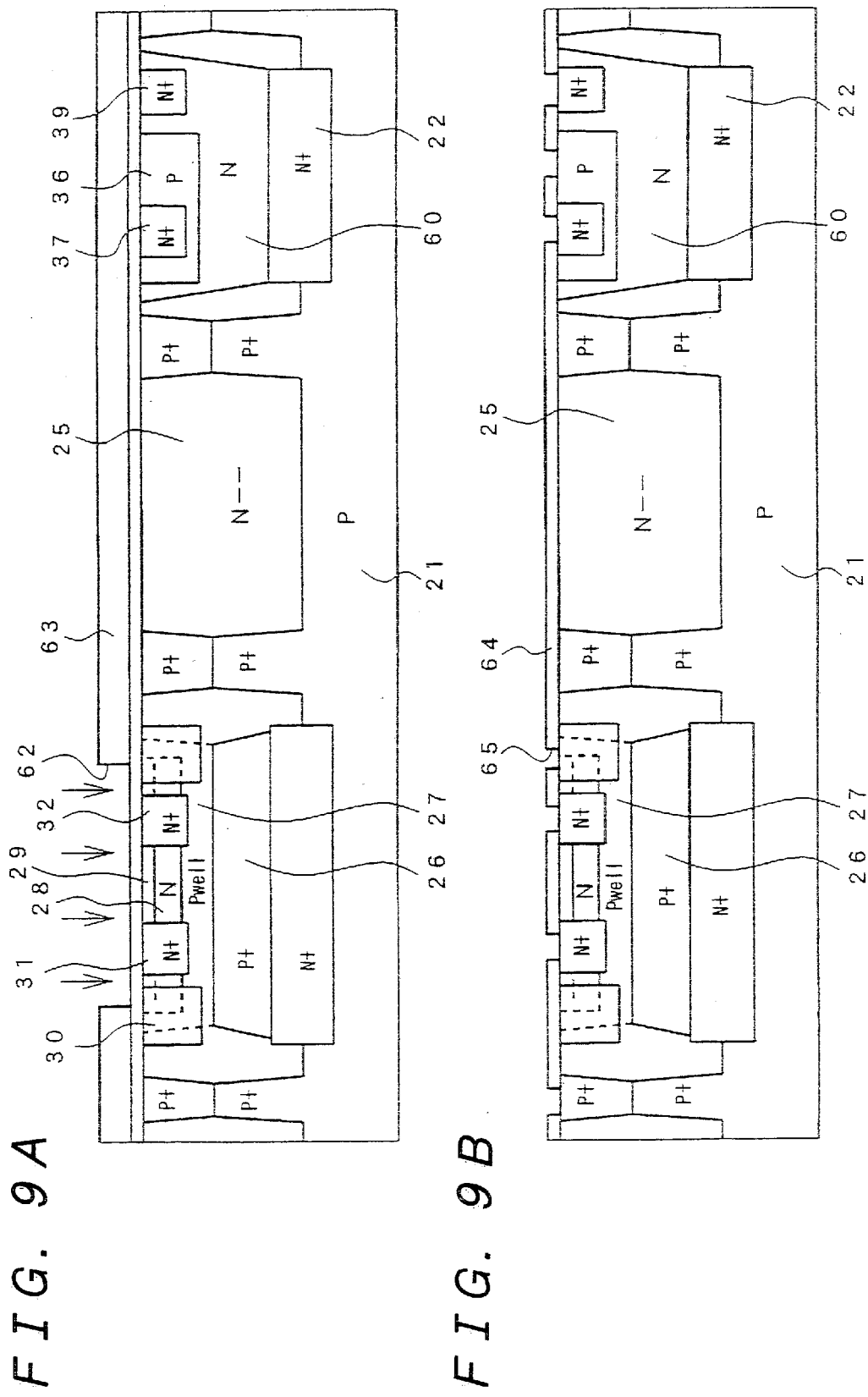

SEMICONDUCTOR DEVICE

BACKGROUND OF THE INVENTION

1. Field of the Invention

The present invention relates to a semiconductor device, more particularly, a semiconductor device that is suitable for use in connecting with electric condenser microphones.

2. Description of the Related Art

A condenser microphone (ECM) is an operational element for converting air vibrations, such as voice speech, into electrical signals in accordance with changes in capacitance between electrodes. Output signals from condenser microphones are extremely weak, so that it is necessary for an amplifying element, for amplifying the output signals from a condenser microphone, to have high input impedance, high gain and low noise.

Semiconductor devices suitable for such applications include junction type field-effect-transistors (J-FET) and metal-oxide-semiconductor (MOS) type FETS. The J-FET has an advantage that the device can be readily produced in a bipolar-type integrated circuit (BIP-IC), as reported in a laid-open Japanese Patent Publication 58-197885, for example.

FIG. 1 shows an example of the structure of the J-FET device (p-channel type). An n-type epitaxial layer 2 is deposited on top of a p-type semiconductor substrate 1. An n-type buried layer 3 is formed between the layers 1 and 2. An island region 5 is formed by the $p^+$-type separation regions 4 surrounding the buried layer 3 so as to connect the surface of the epitaxial layer 2 through to the substrate 1.

An $n^+$-type top gate region 6 is formed on the surface of the island region 5, and a p-type channel region 7 is formed in the lower layer of the top gate region 6. A $p^+$-type source region 8 and a $p^+$-type drain region 9 are formed, respectively, at each end of the channel region 7, and gate contact regions 10 of a high n-dopant concentration are formed on each respective outer region.

Finally, a p-channel type J-FET is produced by fabricating a source electrode 11S, a drain electrode 11D and a gate electrode 11G with an intervening insulation layer 16. Utilizing the p-n junction formed in the gate region, and reverse-biasing this region, controls the strength of the depletion layer thereby controlling the drain current.

When such a circuit configuration is integrated, a p-type base region 12, an $n^+$ type emitter region 13 and an $n^+$ type collector region 14 are formed in the other island region 5, so that an integrated circuit network comprised by the n-p-n transistors and so on, amplifies signals received in the J-FET device.

However, to use such a device for amplifying signals from an electric condensers microphone, it is necessary, in some cases, to provide an expansion electrode 15 of an area much larger than the area of the electrode pads (bonding pads) on the integrated circuit.

When such a structure is fabricated, parasitic capacitances are produced between a capacitor C1 formed by the expansion electrode 15 and the epitaxial layer 2 with the intervening insulation layer 16, on the one hand, and a p-n junction capacitor C2 formed by the epitaxial layer 2 and the substrate 1, where both capacitances become grounded to the substrate 1 biased at the ground potential GND. The magnitude of such parasitic capacitances can reach several tens of pF so that the detrimental effects can reach a level that is not to be ignored.

FIG. 2 shows a schematic circuit diagram that includes the capacitances C1, C2. One end of the ECM is connected to the gate electrode (input terminal) of J-FET 17, and the source electrode of the J-FET 17 is grounded, and the drain electrode is connected to the output terminal OUT. The output terminal OUT is connected to the integrated circuit comprised of n-p-n transistors. The capacitances C1, C2 are connected in series between the gate electrode of the J-FET 17 and the ground potential GND. In such a circuit, output signals from the ECM flows from the ECM to the ground potential GND (shown by current i in the diagram), resulting a problem that the signal level to be impressed on the gate terminal of J-FET 17 is reduced so that desirable output voltage from the ECM cannot be obtained.

SUMMARY OF THE INVENTION

It is an object of the present invention to provide a semiconductor device, which is suitable for use to connect electric condenser microphones.

To achieve the above object, there is provided a semiconductor device, which comprises a conductivity-type substrate, an epitaxial layer formed on top of the substrate; island regions separating the epitaxial layer; an input transistor formed on one of the island regions; an insulation layer covering the surface of the input transistor layer; an expansion electrode formed above the insulation layer so as to provide an electrical connection to an input terminal of the input transistor; and resistivity of the epitaxial layer formed below the expansion electrode being in a range of 100–5,000 Ω·cm.

The present semiconductor device provides an advantage that it is possible to prevent leakage of signal current from the expansion electrode by minimizing the parasitic capacitance formed between the expansion electrode and the substrate, which is at the ground potential. The parasistic capacitance is extremely reduced by increasing the specific resistivity of the epitaxial layer, up to 100–5,000 Ω·cm.

Also, another advantage is that an n-p-n transistor can be fabricated by forming an n-type collector layer within the island region, in spite of the increase in the specific resistivity of the epitaxial layer.

The above and other objects, features, and advantages of the present invention will become apparent from the following description when taken in conjunction with the accompanying drawings which illustrates preferred embodiments of the present invention by way of example.

BRIEF DESCRIPTION OF THE DRAWINGS

FIG. 6A through FIG. 9B are cross sectional schematic views to illustrate the fabrication steps of the semiconductor device of the present invention.

DETAILED DESCRIPTION OF THE PREFERRED EMBODIMENTS

Figure 1:
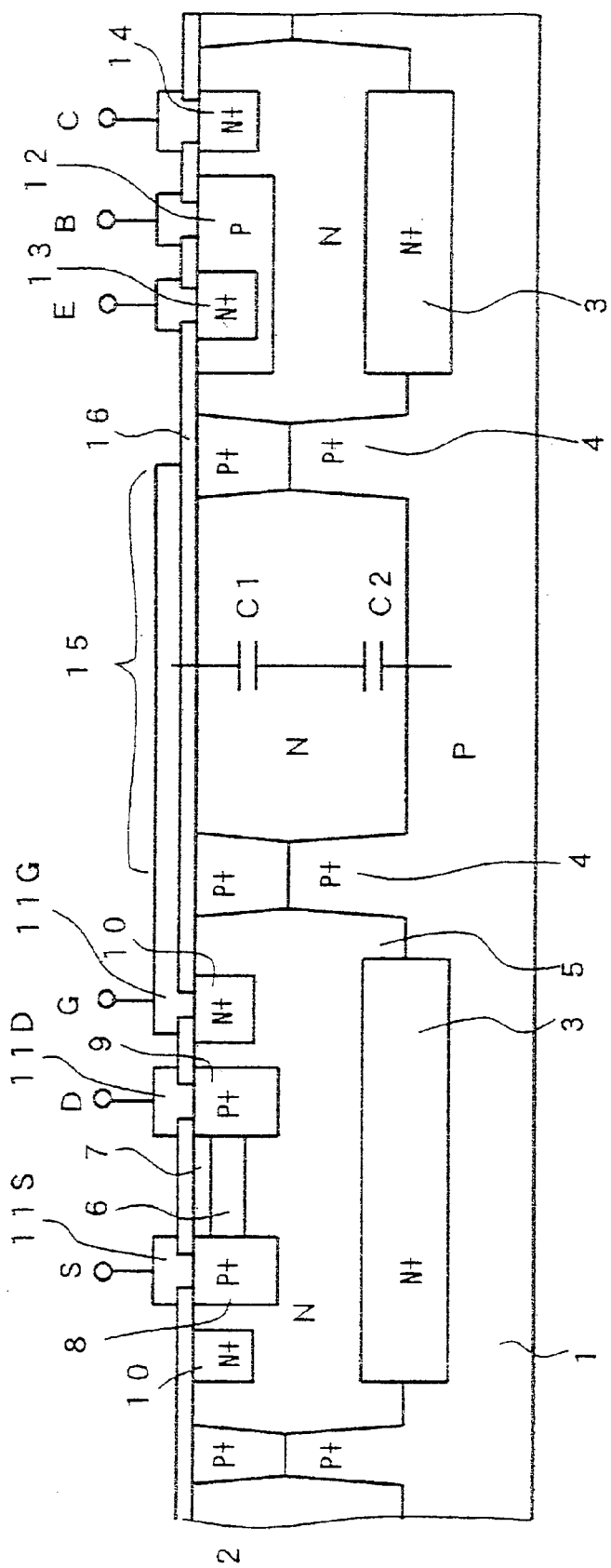
FIG. 1 is a cross sectional schematic view of a semiconductor device.
Figure 2:
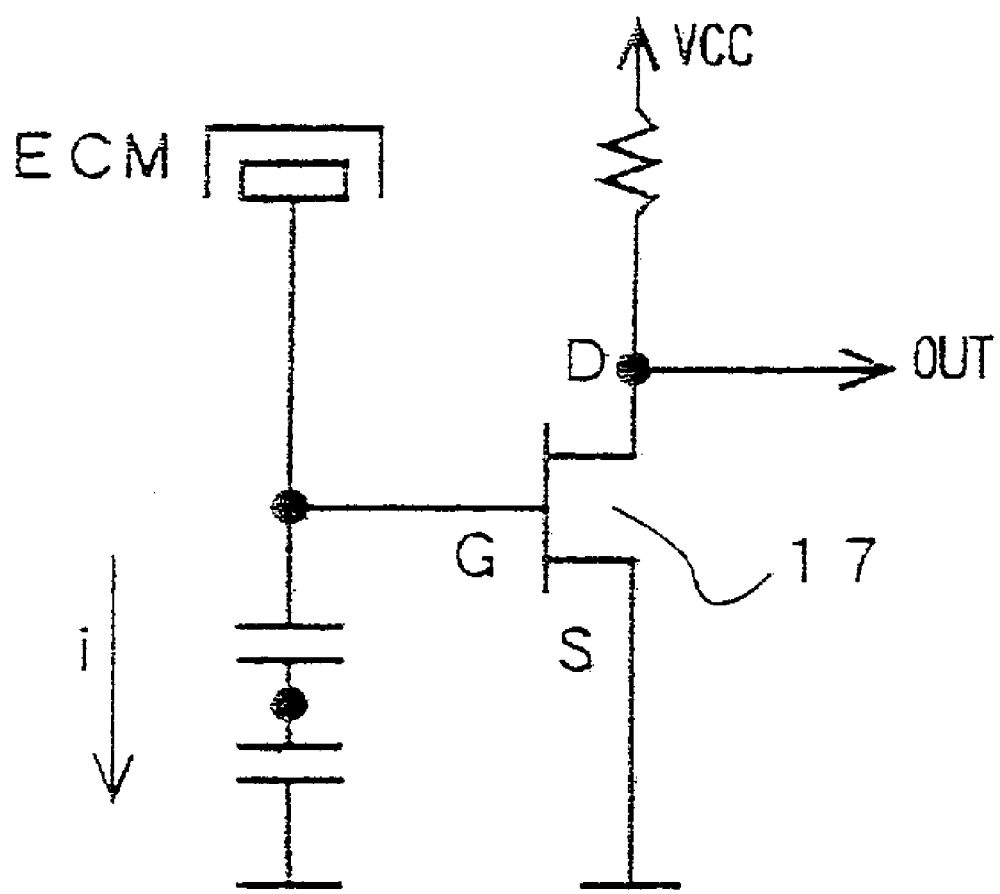
FIG. 2 is a schematic circuit diagram of a semiconductor device.

Preferred embodiment will be presented in the following with referring to the drawings.

Figure 3:
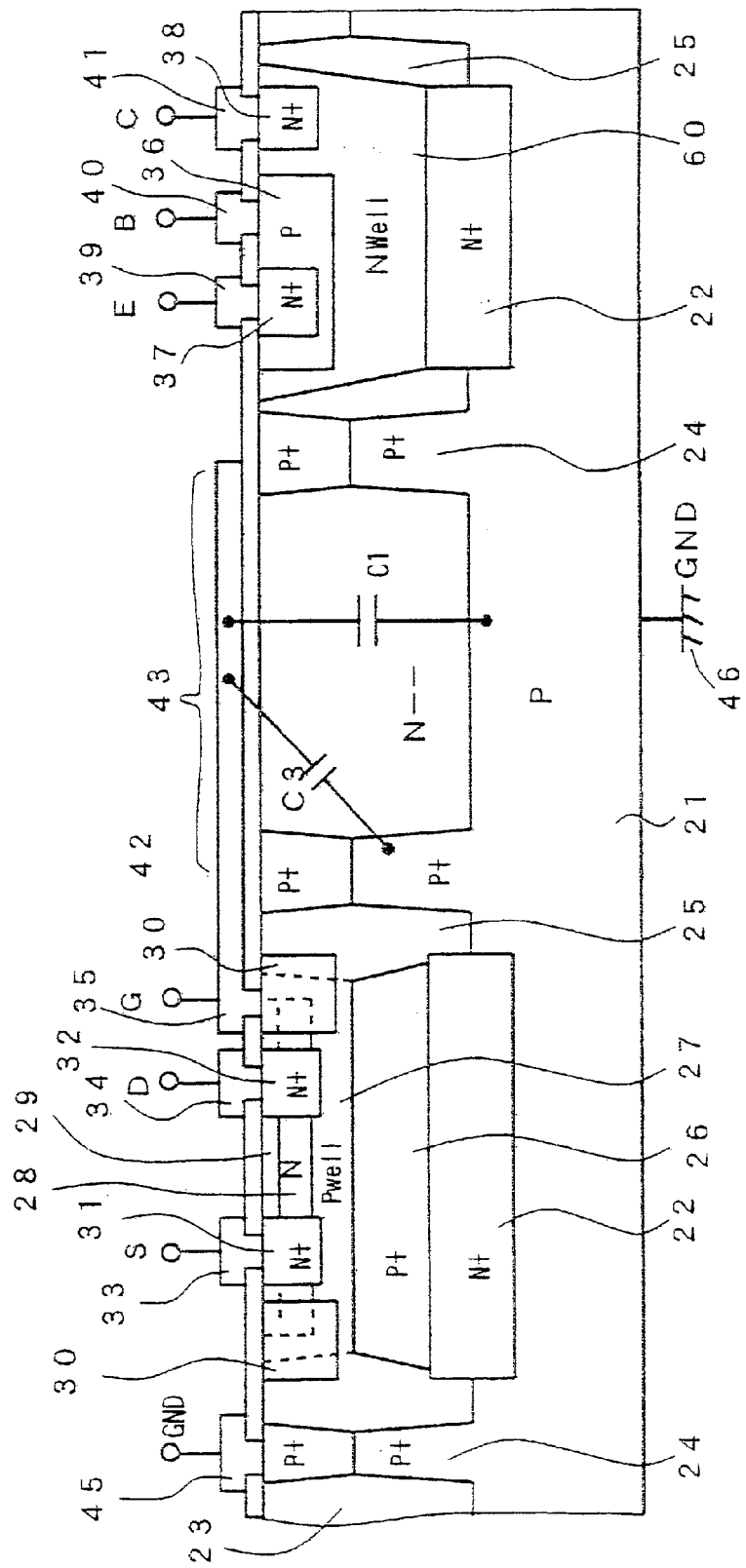
FIG. 3 is a cross sectional schematic view of the layered structure of the semiconductor device according to an embodiment of the present invention.

FIG. 3 shows a schematic cross sectional view of the semiconductor device according to an embodiment of the present invention. The J-FET device is comprised of n-channel field-effect-transistors that are integrated with n-p-n transistors on a common substrate.

The device is fabricated on a p-type single crystal silicon substrate 21. An n$^+$-buried layer 22 is formed on the substrate 21, and an epitaxial layer 23 formed on top of the layers 21,22 is separated into a plurality of island regions 25 by the junctions of the p$^+$-type separation regions 24. Within each island region 25, a p$^+$ buried region 26 is formed to superimpose on the n$^+$ buried layer 22 so that the p$^+$ buried layer 26 can be linked to a p-well region 27 formed by diffusion of dopant from the surface of the island region 25. An n-type channel region 28 and a p$^+$-type top gate region 29 are provided on the top surface of the p-well region 27 so as to bury the n-type channel region 28 (constituting the channel) below the surface of the epitaxial layer 23. The P-well region 27 operates as the back gate.

P$^+$-type gate-contact regions 30 are formed to superimpose on the ends of the channel region 28 and the top gate region 29 so as to overlap the low concentration diffusion regions of the well region 27. An n$^+$ type source region 31 and a drain region 32 are formed so as to penetrate through the channel region 28. The present transistor device controls the channel current between the source/drain regions by forming a depletion layer in the channel region 28 according to the magnitude of the voltage applied between the source electrode 33 and the drain electrode 34 through the gate electrode 35.

In the other island region 25, a collector region (layer) 60 is formed by dopant diffusion to extend from the surface of the epitaxial layer 23 to the n$^+$ buried layer 22. A p-type base region 36 is formed on the surface of the collector region 60, and an n$^+$ emitter region 37 is formed on the surface of the base region 36 so that the collector region 60 completes the structure of an n-p-n transistor device having an emitter electrode 39, a base electrode 40 and a collector electrode 41 in contact with an n$^+$ collector contact region 38.

These electrode groups form an integrated circuit network by making ohmic contacts to the surface of each respective diffusion region, and extending over the silicon oxide film 42 that covers the epitaxial layer 23 so as to provide various component connections. Of these electrode groups, the gate electrode 35 connected to the gate of the J-FET is extended over the oxide film 42, and continues to the expansion electrode 43, which comprises circular patterns of diameters ranging from 1.0 to 1.5 mm, for example. The expansion electrode 43 is connected to the electric condenser microphone.

The bottom section of the expansion electrode 43 opposes an island region 25 with an intervening p$^+$ separation region 24 by way of the oxide film 42. The p$^+$ buried layer 22 is not provided. Also, circuit elements are not housed in any containers.

The ground potential GND is applied to the substrate 21 through the electrode 45 by way of the junction separation region and the back electrode for separation of junctions. The bottom section of the island region 25 below the expansion electrode 43 is used in a floating condition without having any potential applied.

It should be noted here that, in contrast to the valve of the specific resistivity of the epitaxial layer 23 at about 5~20 Ω·cm for normal bipolar n-p-n transistors, a corresponding value for the present device is 100~5000 Ω·cm. The result is that the island region 25 below the expansion electrode 43 assumes a value of resistivity between 100~5000 Ω·cm. Such a high value represents almost an insulative state as far as the circuit performance is concerned. Also, when the resistivity value is as high as 1000 Ω·cm, it is difficult to define any conductivity type, and although it is indicated as n-type, it may be called intrinsic, i-type. Even if the type is inverted to a p-type, there is no effect on the device performance.

Figure 4:
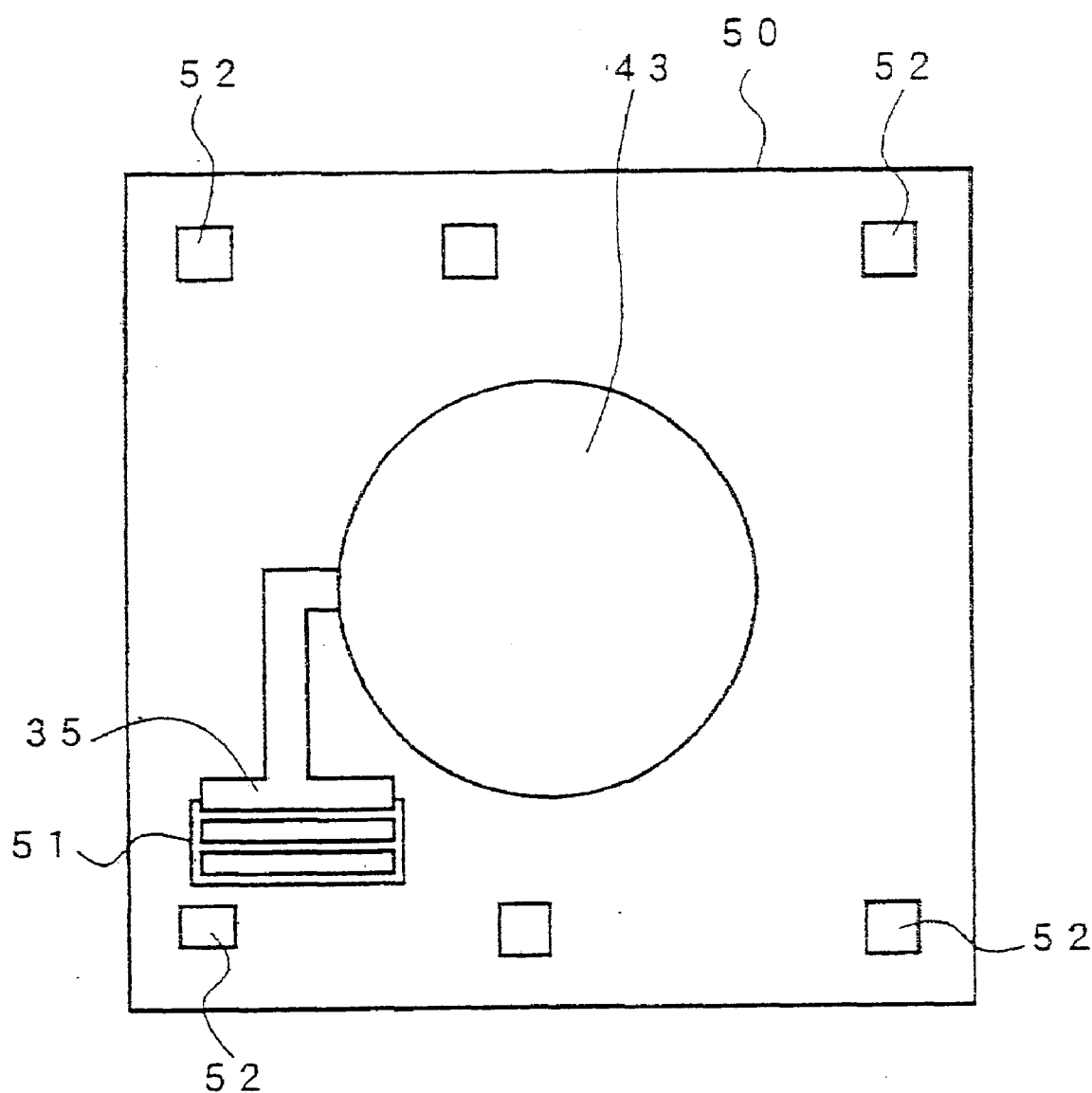
FIG. 4 is a plan view of the semiconductor device of FIG. 3.

FIG. 4 shows a plan view of the overall semiconductor device. The size of the device chip 50 is about 2.5×3.0 mm, and the expansion electrode 43 having a diameter between 1.0~1.5 mm is disposed at about the center of the chip 50, and a part of the expansion electrode 43 is extended to contact the gate electrode 35 of the J-FET. A plurality of bonding pads 52 are provided about the periphery of the chip 50. The bonding pad has a square shape with a perimeter length of about 100~300 μm. Other elements of the device, for example, n-p-n transistor, resistance element and capacitive element are arranged in the free area so as to surround the expansion electrode 43.

Figure 5:
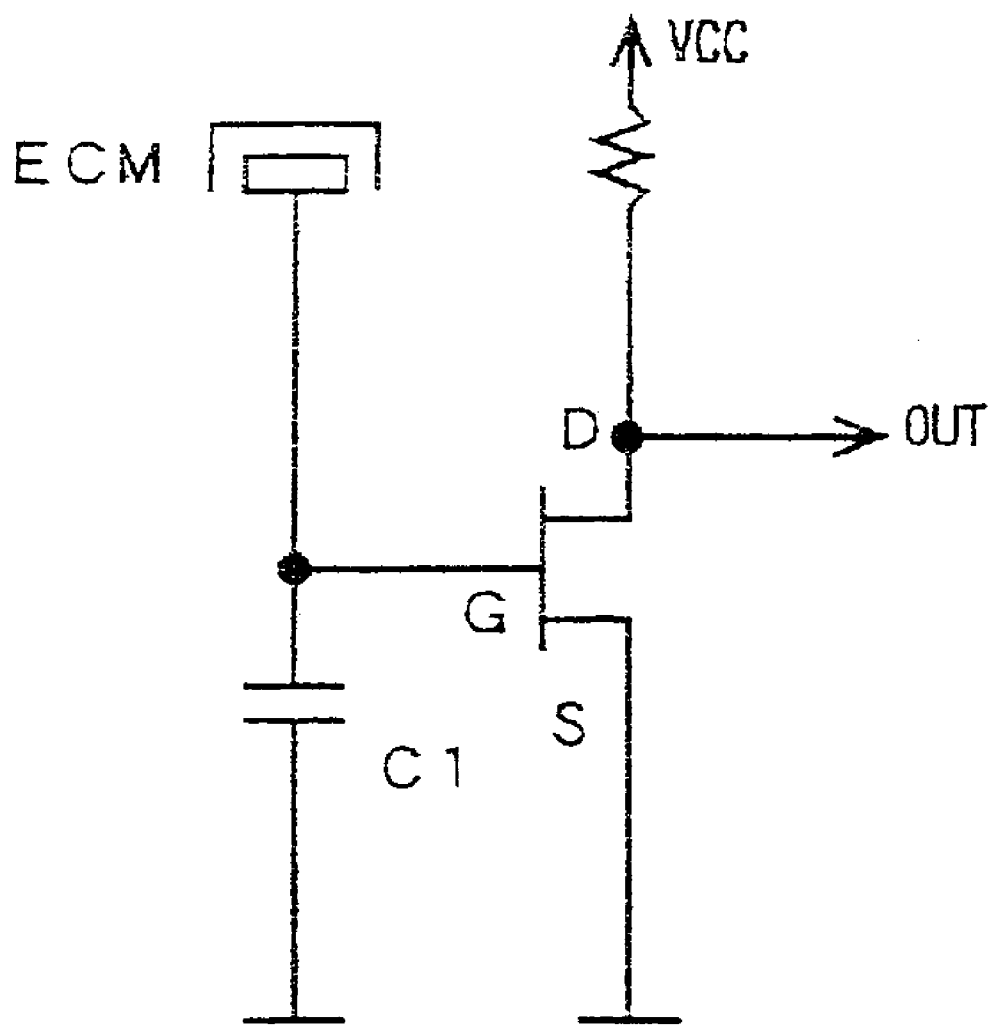
FIG. 5 is a schematic circuit diagram of an embodiment of the present invention.

FIG. 5 shows an equivalent circuit. Because the epitaxial layer 23 is made as a high resistivity region, the series resistance of the island regions 25 is quite high. Also, the depletion layer, which is expected to be formed between the substrate 21 and the boundary sections, is quite expanded, resulting that the value of the parasitic capacitance C1 becomes quite low. If the depletion layer is expanded to a degree to fill the entire area of the island regions 25, the value of capacitance C1 is minimized, and even if it does not expand to such an extent, the circuit connection can be almost severed because of the effect of increasing series resistance. Therefore, it is possible to prevent signal leakage from the expansion electrode 43 to the substrate 21.

Further, although a capacitance C3 is generated by the p-n junction between the island region 25 and the separation region 24, when they are considered in comparison of the areas involved, capacitance C3 represents quite a low value that can be ignored, for example, several mpF compared with several tens of pF for C1. If it is necessary to consider the effects of capacitance C3, it is preferable to design a circuit so that there are no ground potential electrodes in the separation regions 24 surrounding the expansion electrode 43.

It should be noted that, compensating for the fact that the epitaxial layer 23 is made of a high resistivity layer, the collector region 60 is formed so that the doping concentration and its concentration profile are such as to permit the collector region 60 to function as the collector for the n-p-n transistor.

Also, the device is fabricated with the island regions 25 having the J-FET device in the floating state, and furthermore, the high resistivity structure of the epitaxial layer 23 is left therein. Accordingly, by expanding the depletion regions, generated at the junctions between the p-type regions (such as p$^+$ buried layer 27, p-well region 26, gate contact region 30) impressed with the gate potential and the island regions 25, the parasitic capacitance values with reference to the ground potential GND are minimized. This effect contributes also to preventing the current leakage from the expansion electrode 43 to the ground potential.

In the following, methods of manufacturing the device will be explained with referring to FIGS. 6 through 10.

Step 1, Referring to FIG. 6A

A semiconductor substrate 21 is prepared. The surface is heated to produce an oxide film thereon, and openings in the oxide film are produced by photo-etching technology. Antimony (Sb) is diffused in the substrate so as to produce an n$^+$ buried layer 22. Then, oxide film is re-formed and openings are fabricated by photo-etching technology again, and boron (B) ions are injected to produce a p$^+$ buried layer 26 and separation regions 24a on the surface of the substrate 21.

Step 2, Referring to FIG. 6B

Continuing on, after removing the oxide masks used for ion implantation, n-type epitaxial layer 23 is formed by vapor deposition. Film thickness of 5~12 μm is obtained and the resistivity ρ is adjusted to 100~5000 μ·cm. Such a high resistivity value can be obtained by carrying out the vapor deposition process without doping.

Step 3, Referring to FIG. 7A

After forming the epitaxial layer 23, Si oxide film is formed on the surface of the epitaxial layer 23, and a resist masking layer is formed on the oxide film. Boron (B, BF$_2$) ions are injected through the openings produced on the resist masking layer to produce p-type well regions 27. Further, the resist masking layer is replaced with another resist masking layer, and a collector region 60 is formed by P-ion implantation in the required regions for making n-p-n transistors.

Step 4, Referring to FIG. 7B

The entire substrate is subjected to heating at 1100° C. for 1~3 hours to produce thermal diffusion in the p-well regions 27 and the collector region 60 produced by P-ion implantation.

Figure 8A:
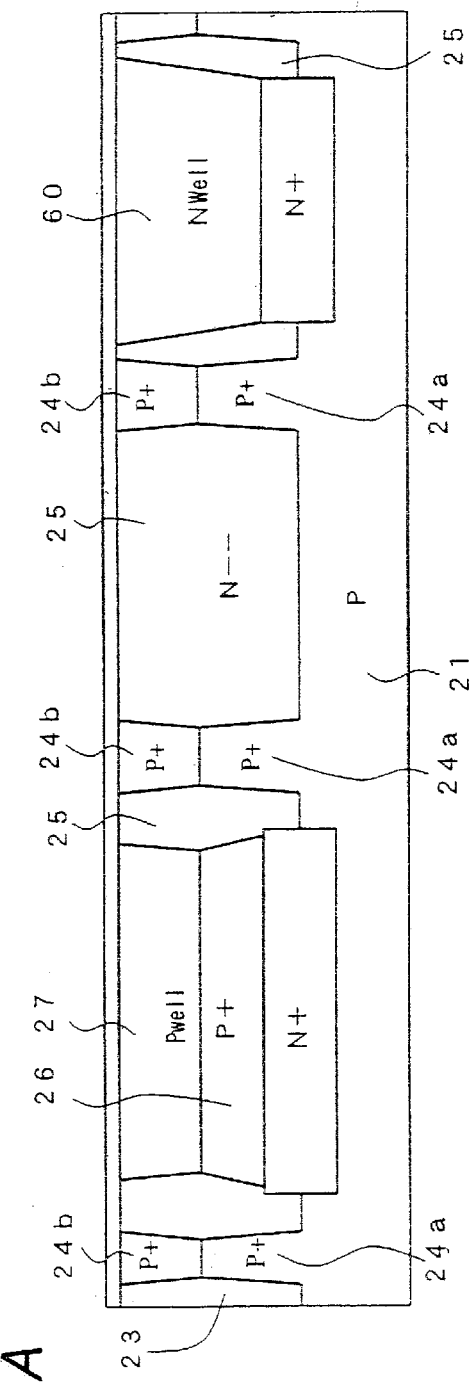

Step 5, Referring to FIG. 8A

Next, after forming a resist masking layer for ion implantation on the silicon oxide film grown on the surface of the epitaxial layer 23 using the heat treatment process, Boron-ion implantation was carried out for p-type doping in the opening sections of the masking corresponding to the separation regions 24b. After removing the resist masking layer, a thermal diffusion treatment, at 1100°C. for 1~3 hours, is carried out until the upper and lower separation regions 24a, 24b, and p$^+$ buried layer 26 and the p-well regions 27 are joined. The island regions 25 are separated into junctions formed in the epitaxial layer 23, for making the junction-type field-effect-transistor (J-FET).

Figure 8B:
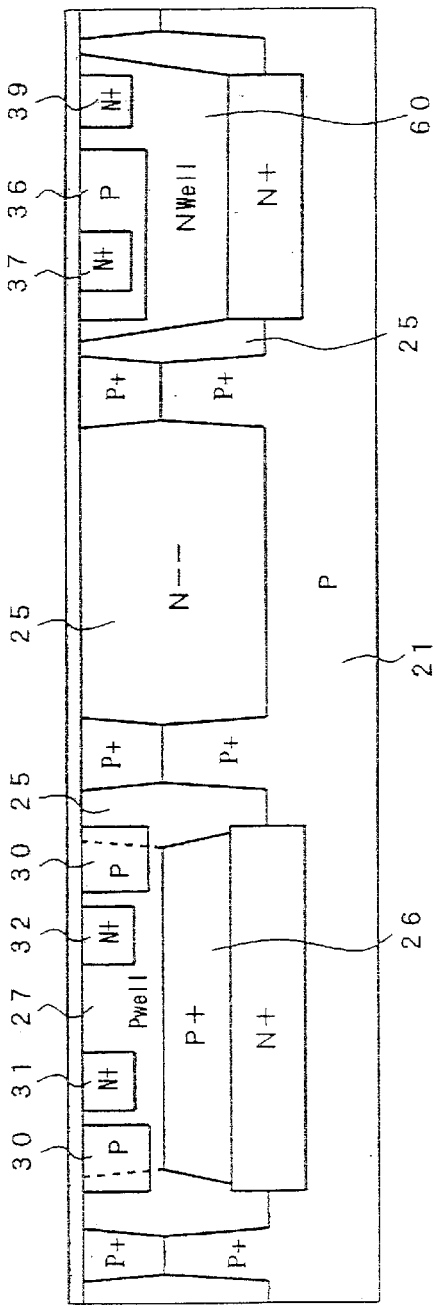

Step 6, Referring to FIG. 8B

After removing the SiO$_2$ film formed on the epitaxial layer 23 by the previous heat treatment process, another SiO$_2$ film of about 500 Å thickness is re-deposited. Photoresist masking layer for ion-implantation is formed on the SiO$_2$ film, and openings are fabricated in the regions corresponding to the base regions 36 of the n-p-n transistors and gate contact regions 30. Boron-ion implantation is carried out to provide doping on the surface exposed through the openings. After removing the resist masking, base diffusion is carried out at 1100° C. for 1~2 hours. Diffusion process is carried out so that the diffused layers of the base region 36 and the gate contact region 30 are shallower than the diffusion layer of the p-well regions 27, and that the gate contact region 30 extends over the top sections of the p-n junction sections formed by the p-well regions 27 and the n-type island regions 25. In other words, the gate contact region 30 surrounds the periphery of p-well region 27 in a ring shape. After this process, ion-implantation masking layer is re-applied so that openings corresponding to emitter regions 37, source regions 31, drain regions 32 and collector contact regions 38 can be provided, and the exposed surface is doped with an n-type dopant such as arsenic (As) or phosphorous (P).

Step 7, Referring to FIG. 9A

Further, resist masking layer is re-applied so that a masking layer 63 is formed on the Silicon oxide layer for making openings 62 in those regions corresponding to channel regions 28. The edge of the opening 62 is located above the gate contact region 30 to expose the surface of the well region 27 and inner periphery of the ring-shaped gate contact region 30. Then, the channel regions 28 are formed by ion-implantation of a p-type dopant, As or P, at a concentration in a range of $10^{12}$~$10^{13}$ atoms/cm$^3$.

Then, another ion-implantation process (using B or BF$_2$) is carried out through the same masking layer 63 at a concentration in a range of $10^{13}$~$10^{14}$ atoms/cm$^3$ to fabricate the top gate regions 29.

Next, the masking layer is removed, and the emitter diffusion process is carried out at 1000° C. for 30~60 minutes to thermally diffuse emitter regions 37, source regions 31, and drain regions 32, and at the same time, to carry out thermal diffusion for the channel regions 28 and the top gate regions 29. Here, ion-implantation and heat treating processes for the channel regions 28 and the top gate regions 29 may be carried out after completing the emitter diffusion process.

Step 8, Referring to FIG. 9B

Next, contact holes 65 are produced on the silicon oxide film 64 thermally-formed on the expitaxial layer 23 using a normal photo-etching technology. Those regions where expansion electrode 43 is formed, are already provided with silicon oxide film 64 of 8000~20,000 Å thickness, but the thickness of the oxide film may be increased further by depositing silicon oxide or silicon nitride film using CVD (chemical vapor deposition).

After this step, the entire surface of the substrate is coated with aluminum film of a thickness in a range of 1.0~3.0 μm, by using sputtering or vacuum vapor deposition method and photo-etched using normal photo-etching method, to provide source electrodes 33, drain electrodes 34, gate electrodes 35, emitter electrodes 39, base electrodes 40, collector electrodes 41, ground electrodes 45 and expansion electrodes 43 to produce the device shown in FIG. 3.

FIG. 10 shows a cross sectional structure to illustrate a second embodiment to fabricating the device. In the previous method, collector region 60 was diffused from the surface of the epitaxial layer 23, but in this method, diffusion is carried out from the surfaces of both the surfaces of the substrate 21 and the epitaxial layer 23.

Figure 10A:
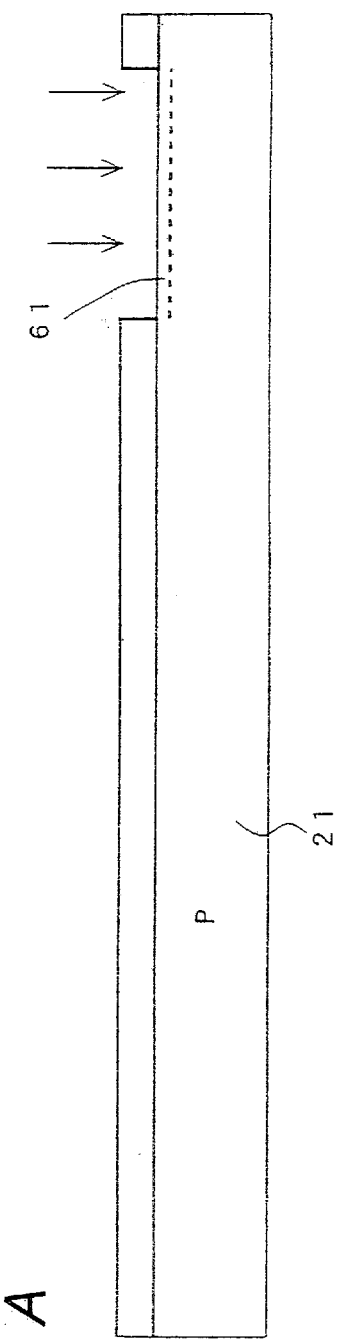
FIG. 10A and FIG. 10B are cross sectional schematic views to illustrate the fabrication steps according to another embodiment of the present invention.

That is, with referring to FIG. 10A, a p-type substrate 21 is prepared, and a selective photo-resist masking layer is formed on the surface of the substrate 21 so that the buried collector layer 61 can be produced by carrying out ion-implantation of n-type dopant, As or Sb and others, for those regions intended for making n-p-n transistors, and heat treating to thermally diffuse the dopants.

Figure 10B:
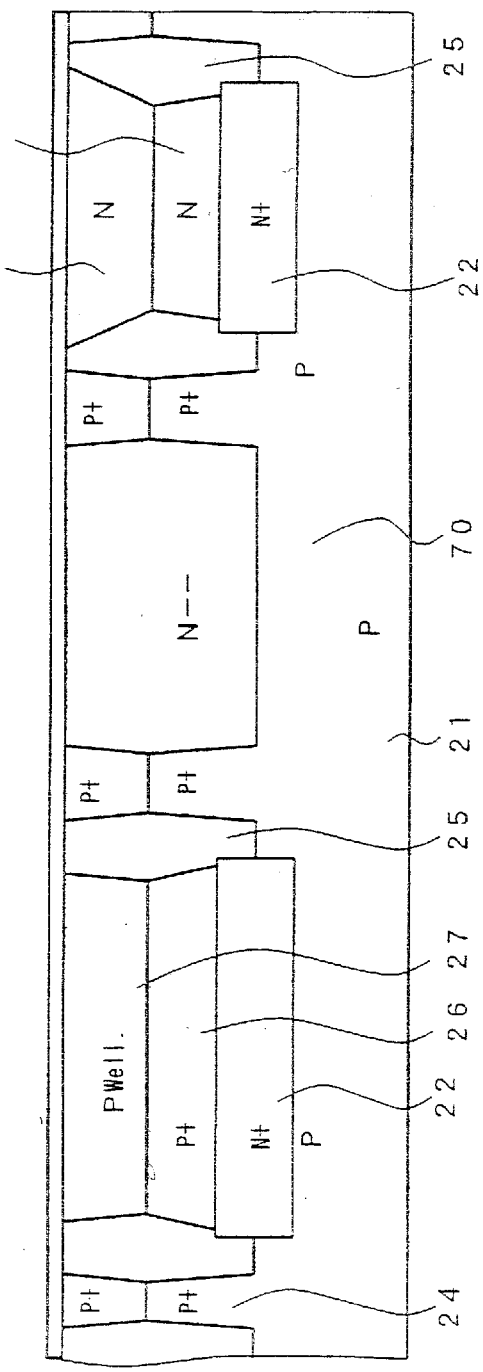

Next, by following the steps shown in FIGS. 6A~8A as in the previous embodiment, the junction structure of the collector layer is produced by joining the collector region 60 and the buried collector layer 61 to obtain the structure shown in FIG. 10B. Subsequent steps are the same as those shown in FIGS. 8B~9B. Heat treating process is shortened because the diffusion process can be carried out from the top surface as well as from the bottom surface of the epitaxial layer.

In the above embodiments, the structure of the J-FET was formed using n-type channels, but p-type channel J-FET can also be produced. Also, input transistor was represented by J-FET, but n- or p-channel type MOSFET can also be used to produce the present semiconductor device.

Although certain preferred embodiments of the present invention have been shown and described in detail, it should be understood that various changes and modifications may be made therein without departing from the scope of the appended claims.

What is claimed is:

1. A semiconductor device for use with an electric condenser microphone, said semiconductor device comprising:

a substrate having a first conductivity type;

an epitaxial layer formed on top of said substrate, said epitaxial layer having a second conductivity type and including separation regions;

an island region formed in said epitaxial layer between said separation regions;

a junction field-effect transistor formed in said island region, said junction field-effect transistor having a gate electrode;

an insulating film formed on said epitaxial layer; and an expansion electrode formed on said insulating film and arranged so as to be connectable to the electric condenser microphone, said expansion electrode being connected to said gate electrode of said junction field-effect transistor, wherein a resistivity of said epitaxial layer formed below said expansion electrode is in a range of 100~5,000 $\Omega \cdot cm$.

2. A semiconductor device according to claim 1, wherein said expansion electrode comprises a circular pattern having a diameter ranging from 1.0 to 1.5 mm.

3. A semiconductor device according to claim 1, further comprising:

a second island region formed in said epitaxial layer, said second island region being separated from said first island region by one of said separation regions; and a bipolar transistor formed in said second island region and having an emitter region, a base region and a collector region.

4. A semiconductor device according to claim 3, wherein said collector region comprises a diffusion region of a conductivity type opposite to said first conductivity type.

5. A semiconductor device according to claim 1, wherein said island region having said junction field-effect transistor located therein is in a floating condition when a potential is not applied.

6. A semiconductor device according to claim 1, further comprising:

a plurality of bonding pads disposed at a peripheral portion of said semiconductor device, wherein said expansion electrode is disposed at approximately a center of said semiconductor device.

7. A semiconductor device for use with an electric condenser microphone, said semiconductor device comprising:

a substrate having a first conductivity type;

an epitaxial layer formed on top of said substrate, said epitaxial layer having a second conductivity type and including separation regions;

an island region formed in said epitaxial layer between said separation regions;

a junction field-effect transistor formed in said island region, said junction field-effect transistor having a gate electrode;

an insulating film formed on said epitaxial layer; and an expansion electrode formed on said insulating film and arranged so as to be connectable to the electric condenser microphone, said expansion electrode being connected to said gate electrode of said junction field-effect transistor, wherein a resistivity of said epitaxial layer formed below said expansion electrode is at least 100 $\Omega \cdot cm$.

8. A semiconductor device according to claim 7, wherein said expansion electrode comprises a circular pattern having a diameter ranging from 1.0 to 1.5 mm.

9. A semiconductor device according to claim 7, further comprising:

a second island region formed in said epitaxial layer, said second island region being separated from said first island region by one of said separation regions; and a bipolar transistor formed in said second island region and having an emitter region, a base region and a collector region.

10. A semiconductor device according to claim 9, wherein said collector region comprises a diffusion region of a conductivity type opposite to said first conductivity type.

11. A semiconductor device according to claim 7, wherein said island region having said junction field-effect transistor located therein is in a floating condition when a potential is not applied.

12. A semiconductor device according to claim 7, further comprising:

a plurality of bonding pads disposed at a peripheral portion of said semiconductor device, wherein said expansion electrode is disposed at approximately a center of said semiconductor device.

* * * * *